(12) United States Patent
Sandgren et al.

(10) Patent No.: US 7,414,856 B2
(45) Date of Patent: Aug. 19, 2008

(54) ELECTRONICS MODULE ASSEMBLY

(75) Inventors: Daniel J. Sandgren, Naperville, IL (US); Joseph R. Clark, Naperville, IL (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 52 days.

(21) Appl. No.: 11/125,993

(22) Filed: May 10, 2005

(65) Prior Publication Data

US 2006/0256541 A1  Nov. 16, 2006

(51) Int. Cl.
*H05K 5/00* (2006.01)
(52) U.S. Cl. ...................................... 361/756; 361/727
(58) Field of Classification Search ................. 361/752, 361/790, 727, 756, 683–686, 797, 728
See application file for complete search history.

(56) References Cited

U.S. PATENT DOCUMENTS

| | | | |
|---|---|---|---|
| 5,818,696 A | 10/1998 | Knoop | |
| 6,195,493 B1 | 2/2001 | Bridges | |
| 6,421,252 B1 | 7/2002 | White et al. | |
| D464,326 S | 10/2002 | Clark et al. | ............... D13/162 |
| 6,545,611 B2 * | 4/2003 | Hayashi et al. | .......... 340/686.4 |
| 6,935,868 B1 * | 8/2005 | Campini et al. | ............... 439/67 |
| 2003/0064611 A1* | 4/2003 | Musolf et al. | ................. 439/43 |
| 2005/0074990 A1* | 4/2005 | Shearman et al. | ............. 439/65 |

FOREIGN PATENT DOCUMENTS

| EP | 0299199 | 1/1989 |
|---|---|---|
| EP | 0317464 | 5/1989 |

* cited by examiner

*Primary Examiner*—Hung S. Bui

(57) ABSTRACT

An electronics module assembly for detachably retaining a pair of electronic sub-modules in a single slot of a chassis. A host module of the electronics module assembly is configured to be detachably received and retained in a slot of the chassis. The host module has a height corresponding with a height of the slot of the chassis. A pair of sub-modules are configured to be detachably received and retained in the host module. The combined height of the sub-modules is no greater than the height dimension of the slot of the chassis. Therefore, where there was once only room for one electronics module in a single slot of the chassis, a pair of sub-modules with the host module may now be utilized in the single slot of the chassis.

20 Claims, 4 Drawing Sheets

ELECTRONICS MODULE ASSEMBLY

RELATED APPLICATION

The present application is related to U.S. design patent application 29/229,718 entitled "ELECTRONICS MODULE ASSEMBLY", to the same inventors.

TECHNICAL FIELD

The present invention relates to headend or central office equipment such as those used by CATV system operators and, more particularly, relates to positioning electronic modules to economize space with in a chassis.

BACKGROUND OF THE INVENTION

Central office or headend locations typically include a plurality of mechanical chassis mounted in a rack for housing electronics such as optical transmitters, receivers, amplifiers, couplers and switches. However, the number of chassis in a rack is limited and, therefore, the number of slots in a chassis for receiving and retaining electronics in limited. Moreover, because of the increased desire for and consumption of video in the forms of HDTV and VOD, along with the ongoing requirement to maintain high data rates to the end user, operators need to make plant upgrades in order to maintain competitive and to satisfy their end customers. Operators are migrating towards a 1:1 transmitter-to-node ratio to reduce node sizes and enable more narrowcast bandwidth.

Therefore, what is needed is a means to increase the number of electronics modules such as transmitters without using additional rack space and without having to reconfigure the existing chassis or power supply.

BRIEF DISCRIPTION OF THE DRAWINGS

DETAILED DESCRIPTION

The present invention will be described more fully hereinafter with reference to the accompanying drawings in which like numerals represent like elements throughout the several figures, and in which an exemplary embodiment of the invention is shown. This invention may, however, be embodied in many different forms and should not be construed as being limited to the embodiments set forth herein; rather, the embodiments are provided so that this disclosure will be thorough and complete, and will fully convey the scope of the invention to those skilled in the art. The present invention is described more fully hereinbelow.

Figure 1:
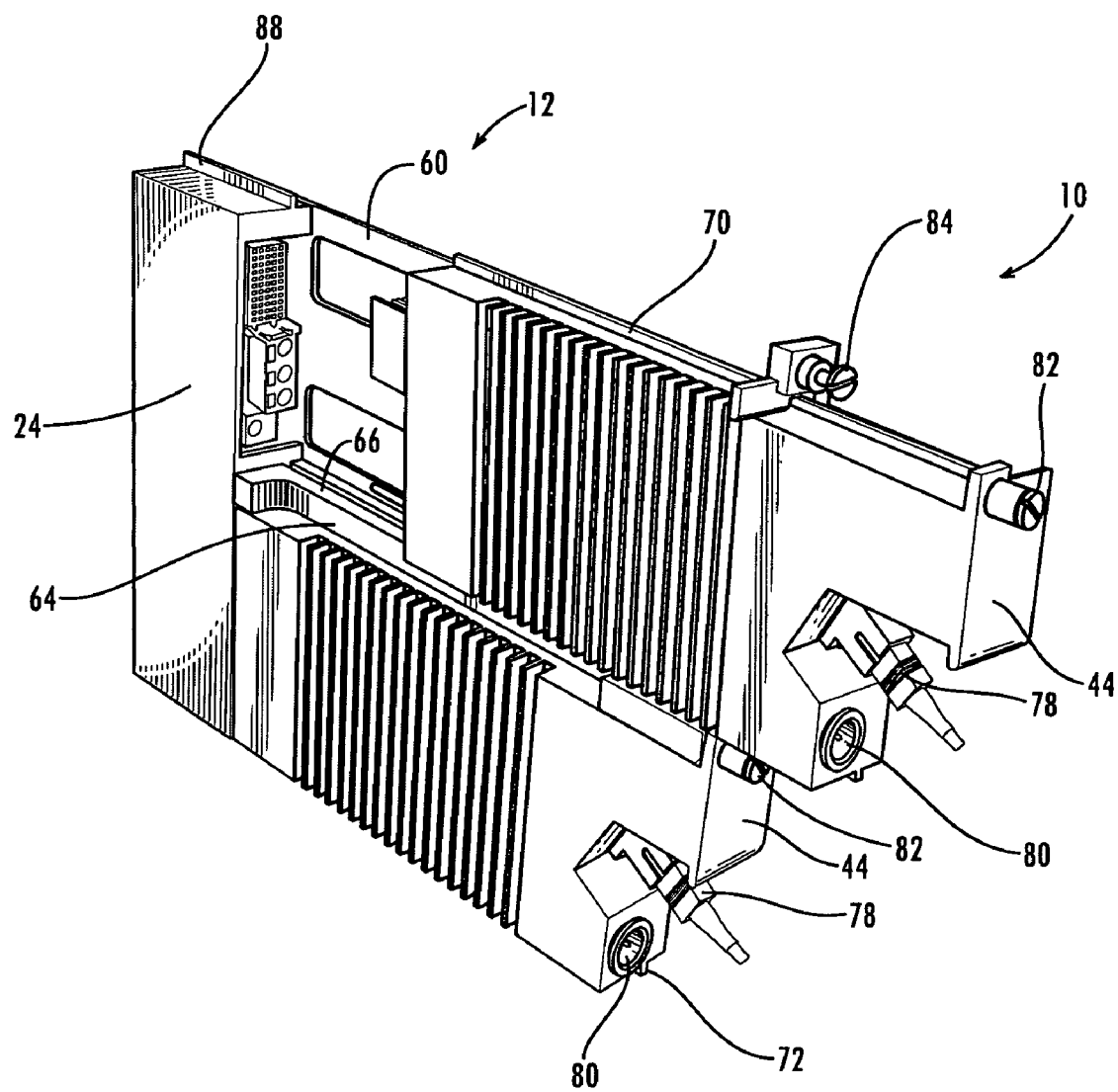
FIG. 1 illustrates a perspective view of an electronics module assembly according to one embodiment of the invention.
Figure 2:
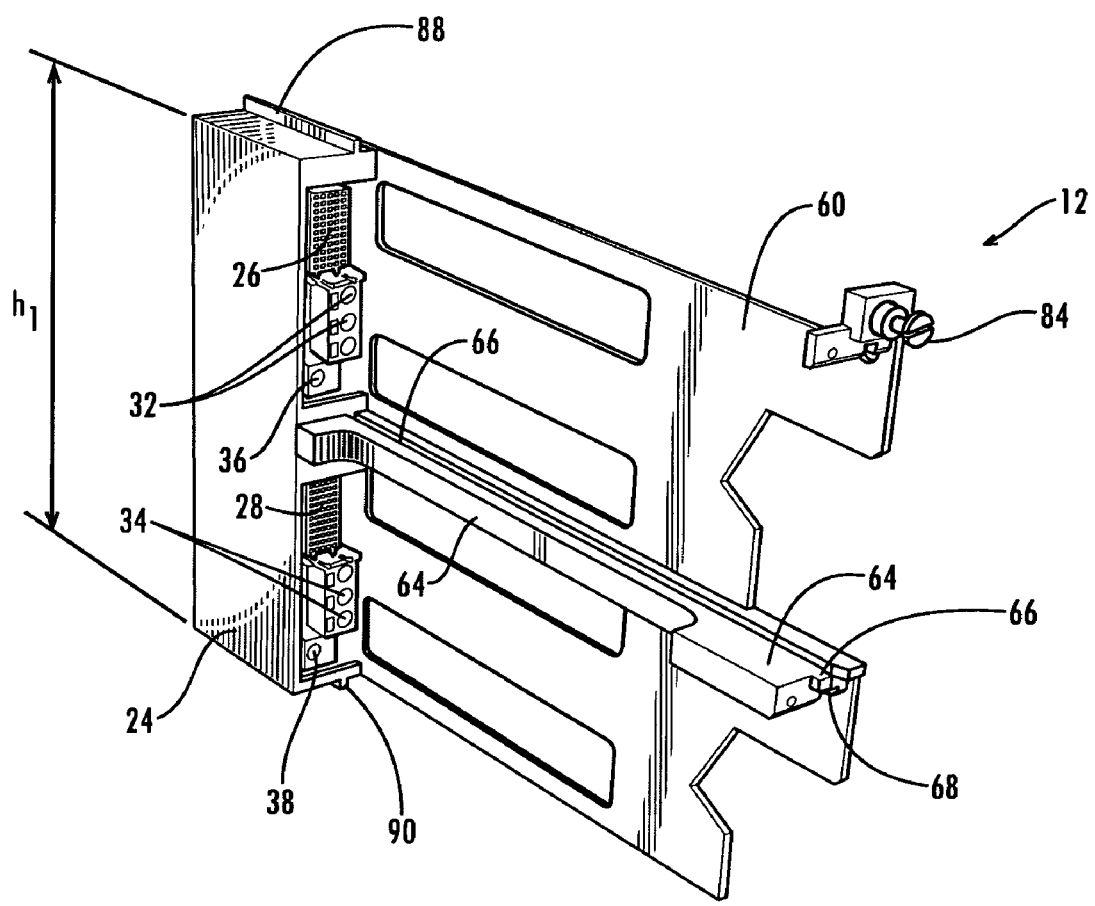
FIG. 2 illustrates a perspective view of a host module of the electronics module assembly of FIG. 1.
Figure 3:
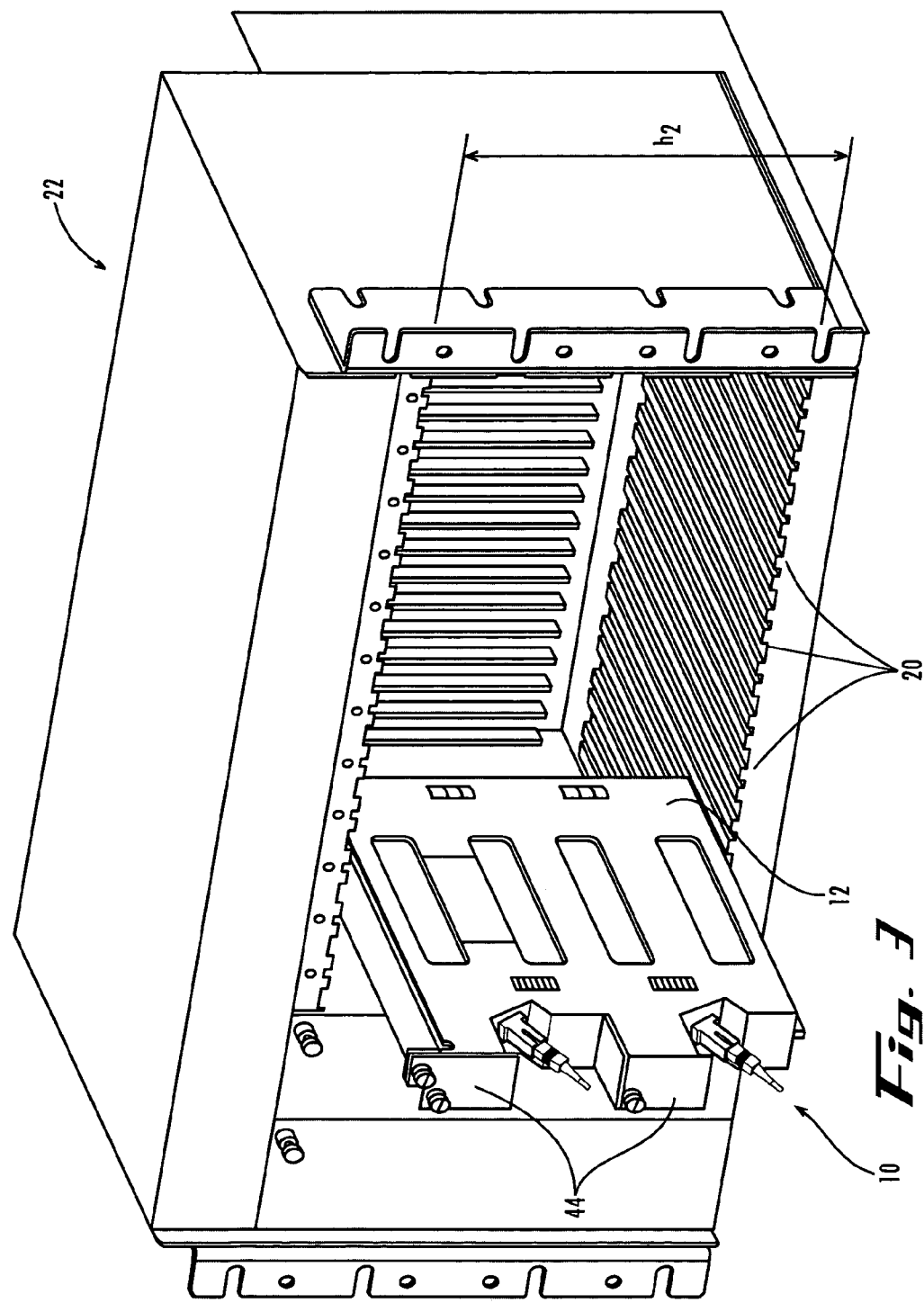
FIG. 3 illustrates a perspective view of a chassis with one of the electronics modules of FIG. 1 partially received in a slot of the chassis.

The present invention allows operators to at least double there transmitter density while still employing their incumbent hardware which in effect will reduce the power draw per transmitter by at least one half. FIG. 1 illustrates a perspective view of an electronics module assembly 10 according to one embodiment of the invention. The electronics module assembly 10 includes a host module 12, shown in FIG. 2, configured and sized to be received and retained in one of the slots 20 of a chassis 22 as shown in FIG. 3. The host module 12 provides the capability of accepting more than one electronics module such as a transmitter when the hub module 12 is slid into a chassis.

For supplying power, the host module 12 includes a base portion 24 that includes a first plurality of female connectors 26 and a second plurality of female connectors 28. The base portion 24 also may include a first set of male RF connectors 32 and a second set of male RF connectors 34. The male RF connectors 32, 34 may be shield by a plastic material as shown in FIG. 2. The base portion 24 may also include a first female grounding connector 36 and a second female grounding connector 38. The first plurality of connectors 26, RF connectors 32, and grounding connector 36 are utilized to mechanically and electrically couple a sub-module 44, shown in FIG. 4, to the base portion 24 of the host module 12. The second plurality of connectors 28, RF connectors 34, and grounding connector 38 are utilized to mechanically electrically couple a second sub-module 44 to the base portion of the host module 12.

The base portion 24 of the host module 12 also mechanically and electrically couples to the inside of the chassis 22. Preferably, the side of the base portion opposite the side having the connectors 26, 28 and RF connectors 32, 34 also include female connectors and female RF connectors to mechanically and electrically connect with the chassis as a known electronics module would. The chassis typically includes a plurality of male connectors for receiving a single electronics module.

For example, a total of 110 pins would have been utilized to power a single electronics module in a slot of the chassis. According to the present invention, however, the host module 12 would now have 110 connections in a slot of the chassis. Moreover, because the signal and power connections are divided between multiple locations, the number of connections need to couple with the chassis is divided by the host module between the sub-modules utilized in the host module. For example, the plurality of connectors 26 and plurality of connectors 28 would each include 55 female connectors to receive the corresponding 55 male connectors of the first sub-module and the corresponding 55 male connectors of the second sub-module. Therefore, each of the sub-modules draws only one half of the power, keeping the total power usage per chassis constant. Also, the optional RF connections typically utilized with a single electronics module are divided by the host module to form RF connectors 32, 34 for coupling separate sub-modules. However, other types and combinations of connectors may be utilized.

Still referring to FIG. 2, the host module also includes a substantially planar side portion 60 which extends from an edge of the base portion 24. The combined length of the base portion 24 and the side portion 60 of the host module 12 substantially corresponds with the depth of a slot 20 of the chassis 22. The host module 24 also includes an elongated central portion 64 that extends outward from the base portion 24 along the side portion 60. The central portion 64 includes position guide slots 66, 68 for receiving position guide rails 70, 72 that run along the length of the top and bottom of the sub-modules 44. Therefore, the center portion's position guide slot 66 receives corresponding position guide rail 72 on the bottom of the upper sub-module 44, and the center portion's position guide slot 68 receives corresponding position guide rail 70 on the top of the lower sub-module 44.

Figure 4:
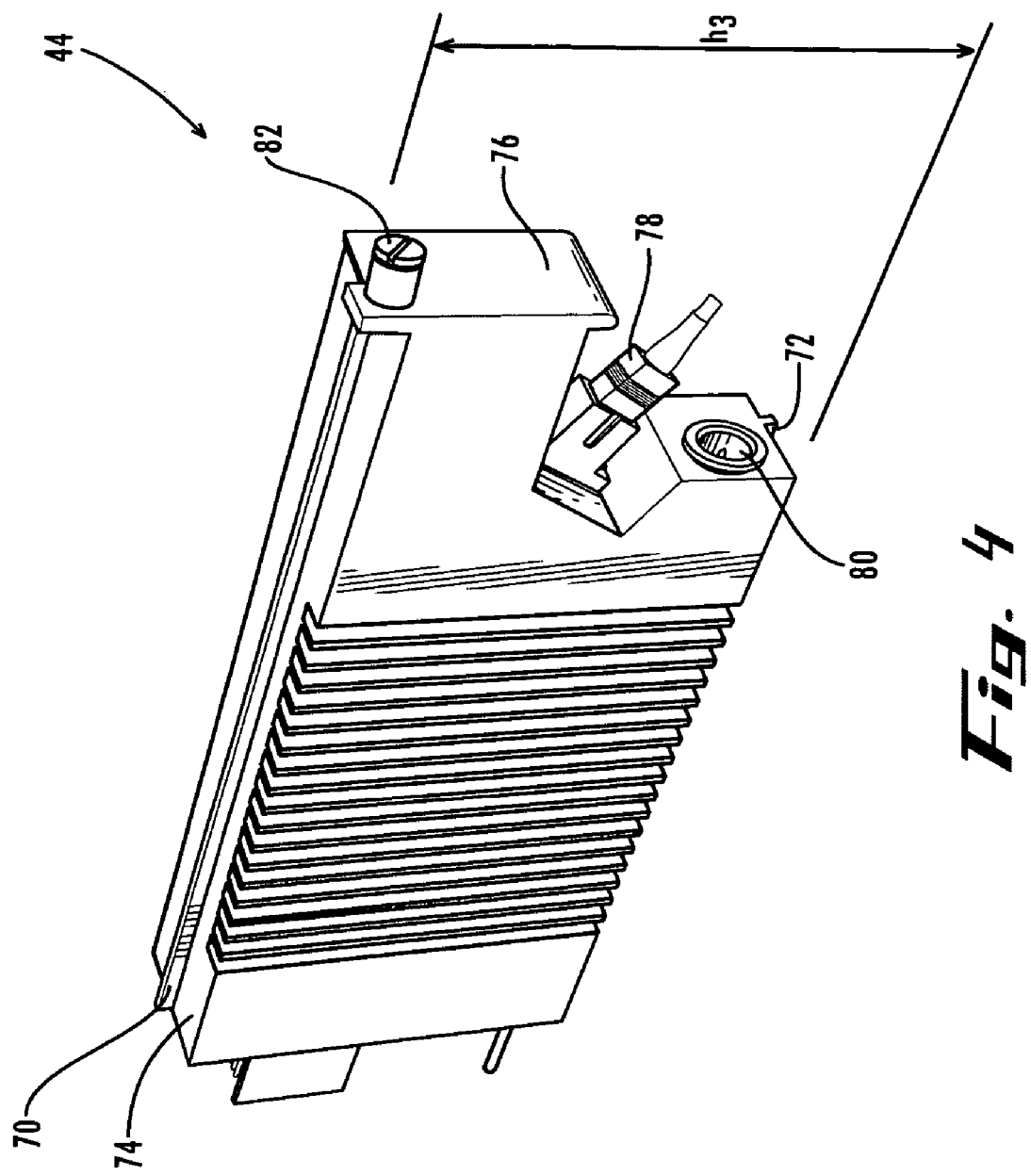
FIG. 4 illustrates a perspective view of a sub-module of the electronics module assembly of FIG. 1.

Referring now to FIG. 4, note that the longest dimension of a sub-module 44 is its horizontal depth as a result of the manner in which known electronics modules are typically received and retained within a slot 20 of a chassis 22. Therefore, the top of the sub-module 44 is indicated by reference number 74 and the front of the sub-module 44 is indicated by reference number 76. Each sub-module 44 includes internally at least the functionality of any known electronics module, but is configured to economize space by having smaller external dimensions. Each sub-module 44 includes on its front 76 an optical output connector such as laser aperture 78 and a RF test port 80. Each sub-module 44 may also include indictors such as an alarm indicator and laser indicator. Each sub-module 44 may also include a fastener such as a thumb screw 82 for securing itself to the host module 12. As best shown in FIG. 1, thumb screws 82 are utilized to secure the sub-modules 44 to the host module 12. One of the thumb screws 82 is utilized to secure one of the sub-modules 44 to the central portion 64 of the host module 12. Another thumb screw 84 is used to secure the host module 12 to the chassis 22 as would be used to secure a single known electronics module.

As best shown in FIGS. 1 and 4, each sub-module 44 is keyed to the host module 12. As explained above, each sub-module 44 includes a position guide rail 70 on its top and another position guide rail 72 on its bottom. Each guide rail 70, 72 preferably extends substantially from the front 76 to the back of the sub-module 44. However, it is also preferable that the portion of the guide rails 70, 72 at the back of each sub-module 44 align with position guide rails 88, 90 on the top and bottom of the host module 12. The guide rails 88, 90 of the host module 12 preferably extend substantially along the entire length of the base portion 24 of the host module 12. Therefore, the combination of the position guide rail 88 on the top of the base portion 24 of the host module 12 and the position guide rail 70 on the top 74 of the upper sub-module 44 is to correspond with a position guide slot within a slot 20 along the top of the inside of a chassis 22, and the combination of the position guide rail 90 on the bottom of the base portion 24 of the host module 12 and the position guide rail 72 on the bottom of the lower sub-module 44 is to correspond with another position guide slot within the same slot 20 along the bottom of the inside of the chassis 22.

Referring now to FIGS. 2, 3 and 4, the host module 12 has a height dimension $h_1$ which substantially corresponds with a height $h_2$ of a slot 20 within the chassis. Each sub-module 44 has a height $h_3$ which is less than either the height $h_1$ of the host module 12 or the height $h_2$ of the slot 20. However, the combination of the heights $h_3$ of a pair of sub-modules should be approximately equal to the height $h_1$ of the host module 12 and, therefore, should be approximately equal to the height $h_2$ of the slot 20 of the chassis 22. Thus, where there was once only room for one electronics module in a single slot 20 of the chassis 22, a pair of sub-modules 44 within the host module 12 may now be utilized in the single slot 20 of the chassis 22.

The foregoing has broadly outlined some of the more pertinent aspects and features of the present invention. These should be construed to be merely illustrative of some of the more prominent features and applications of the invention. Other beneficial results can be obtained by applying the disclosed information in a different manner or by modifying the disclosed embodiments. Accordingly, other aspects and a more comprehensive understanding of the invention may be obtained by referring to the detailed description of the exemplary embodiments taken in conjunction with the accompanying drawings, in addition to the scope of the invention defined by the claims.

What is claimed is:

1. An electronics module assembly to be received and retained within a chassis having a plurality of slots, each said slot having a height dimension, said electronics module assembly comprising:
   a host module configured to be detachably received and retained in one of said slots of said chassis, said host module having a height corresponding with said height dimension of said slots of said chassis; and
   at least two sub-modules configured to be detachably received and retained by said host module, said at least two sub-modules each having a height less than said height dimension of said slot of said chassis, said at least two sub-modules having a position guide rail to be detachably received and retained in a position guide slot of said chassis so that said at least two sub-modules with said host module may be utilized in a single said slot of said chassis.

2. The electronics module assembly of claim 1 wherein said at least two sub-modules have a combined height approximately equal to said height of said host module.

3. The electronics module assembly of claim 1 wherein said sub-module is an optical electronics module.

4. The electronics module assembly of claim 1 wherein said sub-module is keyed to said host module.

5. The electronics module assembly of claim 1 wherein said host module comprises at least one position guide slot for receiving the position guide rail of said sub-module.

6. The electronics module assembly of claim 5 wherein said host module further comprises at least one position guide rail to be received by a position guide slot of said chassis.

7. The electronics module assembly of claim 6 wherein said host module further comprises a center portion configured to extend between a pair of sub-modules retained within said host module, said center portion having one of said position guide slots on opposite sides of said center portion for receiving corresponding said position guide rails of each of said sub-modules.

8. The electronics module of claim 1 further comprising a second sub-module to be detachably received and retained by said host module, first means for fastening a first sub-module to said host module and second means for fastening said second sub-module to said host module, and third means for fastening said host module in said slot of said chassis.

9. The electronics module of claim 1 wherein said host module is adapted to permit each of a pair of sub-modules to be electrically coupled to said chassis by both a signal connection and a power connection.

10. The electronics module assembly of claim 1 wherein said host module separates a signal connection to provide multiple signal connections for a single said slot of said chassis, and separates a power connection to provide multiple power connections for said single slot of said chassis, wherein multiple sub-modules may be coupled in said slot of said chassis by said host module.

11. An electronic module assembly to be received and retained within a chassis having a plurality of slots, each said slot having a height dimension, said electronics module assembly comprising:
   a host module configured to be detachably received and retained in one of said slots of said chassis, said host module having a height corresponding with said height dimension of said slots of said chassis and a position guide rail to be received by a position guide slot of said chassis; and
   at least one sub-module configured to be detachably received and retained by said host module, said sub-module having a position guide rail and a height less than said height dimension of said slot of said chassis, wherein more than one sub-module with said host module may be utilized in a single said slot of said chassis and wherein said position guide rail of said host module aligns with said position guide rail of said sub module.

12. The electronic module assembly of claim 11, wherein said host module comprises at least one position guide slot for receiving said position guide rail of said sub-module.

13. A method of loading electronics modules in slots of a chassis, said method comprising the following steps:
    detachably receiving and retaining a pair of sub-modules in a host module, said sub-modules having position guide rails and a combined height dimension corresponding with a height of one of said slots of said chassis; and
    detachably receiving and retaining said host module and said position guide rails in said one slot of said chassis, said host module having a height dimension corresponding with said height of said one slot, wherein more than one sub-module with said host module may be utilized in said one slot of said chassis.

14. The method of claim 13 further comprising the step of detaching one of said sub-modules of said pair of sub-modules from said host module in order to remove said one sub-module from said slot of said chassis.

15. The method of claim 13 further comprising the step of substantially simultaneous inserting each said sub-module of said pair of sub-modules into said slot of said chassis as a result of said host module being inserted into said slot of said chassis.

16. The method of claim 13 further comprising the step of separating each of a single signal connection and a single power connection into multiple signal connections and multiple power connections by utilizing said host module in said slot of said chassis.

17. The method of claim 13 further comprising the step of guiding said host module into a position guide slot of said chassis in order to position said host module into said slot of said chassis.

18. The method of claim 13 further comprising the step of guiding said sub-modules into position guide slots of said host module in order to position said sub-modules into said host module.

19. A method of loading electronics modules in slots of a chassis, said method comprising the following steps:
    detachably receiving and retaining a pair of sub-modules in a host module, said sub-modules having position guide rails and a combined height dimension corresponding with a height of one of said slots of said chassis;
    detachably receiving and retaining said host module and said position guide rails in said one slot of said chassis, said host module having a height dimension corresponding with said height of said one slot, wherein more than one sub-module with said host module may be utilized in said one slot of said chassis; and
    detaching said host module from said slot of said chassis in order to remove each said sub-module of said pair of sub-modules substantially simultaneously.

20. A method of loading electronics modules in slots of a chassis, said method comprising the following steps:
    detachably receiving and retaining a pair of sub-modules in a host module, said sub-modules having position guide rails and a combined height dimension corresponding with a height of one of said slots of said chassis;
    detachably receiving and retaining said host module and said position guide rails in said one slot of said chassis, said host module having a height dimension corresponding with said height of said one slot, wherein more than one sub-module with said host module may be utilized in said one slot of said chassis; and
    aligning a guide rail of said host module with a guide rail of said sub-modules.

* * * * *